(12) United States Patent
Fukuda

(10) Patent No.: US 6,541,130 B2
(45) Date of Patent: *Apr. 1, 2003

(54) ORGANIC ELECTROLUMINESCENCE MULTI-COLOR DISPLAY AND METHOD OF FABRICATING THE SAME

(75) Inventor: Yoshinori Fukuda, Tsurugashima (JP)

(73) Assignee: Pioneer Corporation, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/567,033

(22) Filed: May 8, 2000

(65) Prior Publication Data

US 2003/0044639 A1 Mar. 6, 2003

(30) Foreign Application Priority Data

May 12, 1999 (JP) ............................... 11-131501

(51) Int. Cl.[7] ............................. B32B 7/00; C09K 11/00; H05B 33/00
(52) U.S. Cl. ........................ 428/690; 428/917; 313/502; 313/503; 313/504; 313/506; 257/88; 257/89
(58) Field of Search ................................ 428/690, 917; 313/502–506; 257/88, 89

(56) References Cited

U.S. PATENT DOCUMENTS

| 5,503,910 A | * | 4/1996 | Matsuura et al. | ............ 428/212 |
| 5,554,911 A | * | 9/1996 | Nakayama et al. | ......... 313/504 |
| 5,707,745 A | * | 1/1998 | Forrest et al. | ............... 428/432 |
| 6,117,529 A | * | 9/2000 | Leising et al. | ............... 428/690 |

\* cited by examiner

*Primary Examiner*—Cynthia H. Kelly
*Assistant Examiner*—Dawn Garrett
(74) *Attorney, Agent, or Firm*—Sughrue Mion, PLLC

(57) ABSTRACT

Disclosed is an organic electroluminescence multi-color display comprising a transparent electrode, a plurality of organic compound material layers including at least light emitting layers, a metal electrode, which are stacked on a transparent substrate in sequence, respectively, and a plurality of organic electroluminescence elements comprising the light emitting layers made of different organic compound materials and taking on different colors of light emission. Each of functional layers, having the same function, of the organic compound material layers excluding the light emitting layers are different in thickness corresponding to a color of emitted light.

22 Claims, 8 Drawing Sheets

LIGHT EMISSION

ORGANIC ELECTROLUMINESCENCE MULTI-COLOR DISPLAY AND METHOD OF FABRICATING THE SAME

BACKGROUND OF THE INVENTION

1. Field of the Invention

The present invention relates to an organic electroluminescence multi-color display (also referred to as an organic EL multi-color display hereinafter) comprising a plurality of organic electroluminescent elements (hereinafter also referred to as organic EL elements) using an electroluminescent organic compound emitting light by injection of an electric current and provided with an emission layer made from such an organic electroluminescent material and moreover to a process for fabricating the organic EL multi-color display.

2. Description of the Related Art

The organic EL element using the organic compound material is typically a light emitting element having diode characteristic of an electric current injection type which emits light at the intensity corresponding to the amount of current. A display panel having a plurality of such EL elements arranged in a matrix has been developed. The display panel includes a substrate structure as shown in FIG. 1 which is fabricated in the following manner. An indium-tin-oxide (so-called ITO) film is deposited on a glass substrate 2 serving as a display screen, and the obtained ITO film is patterned by means of etching, thereby an anode 3 is formed on the substrate as a transparent electrode. Each organic EL device 1 constituting the display panel has a multi-layer structure wherein a plurality of organic compound material layers 4 including a light emitting layer and a cathode 5 (a metal electrode) have been deposited in this order on the anode 3 (a transparent electrode) by vacuum vapor deposition or the like. When required, the organic compound material layer 4 is provided with a hole transport function layer (a hole injection layer, a hole transport layer) and an electron-transport-function layer (an electron injection layer, an electron-transport layer) in addition to the light-emitting layer.

For example, Japanese Patent No. 2846571 discloses an organic EL element in which the thickness of the ITO anode and a plurality of organic compound material layers are so set that the desired wavelength of the light obtained from the light emitting layer can have a peak wavelength.

In the conventional organic EL element, the thicknesses of the ITO anode and a plurality of organic compound material layers are set in such a manner that the spectrum of the light obtained from the light emitting layer can have a desired peak wavelength. If such conventional organic EL element is adapted to an organic EL multi-color display, then a change of the thickness of the ITO anode is required so as to depend on the pixel for emitting light of a different color, that is, on each of the organic EL elements.

Since the ITO anode is deposited uniformly on the entire surface of a transparent substrate and thereafter formed into the desired thickness and pattern by etching, it is difficult to vary the thickness of the ITO anode partly for many elements on the same display substrate. In addition, this uneven ITO anode would make the manufacture of the display panel complicated since the ITO needs to repeat a deposition process partly in order to vary the thickness of the ITO anode in part.

OBJECT AND SUMMARY OF THE INVENTION

An object of the present invention is to provide an organic EL multi-color display and a method for fabricating the organic EL multi-color display, which can be fabricated easily and provides an excellent external quantum efficiency of light.

An organic electroluminescence multi-color display according to the present invention comprises: a transparent substrate; and a plurality of organic electroluminescence elements each including, a transparent electrode, a plurality of organic compound material layers including at least one light emitting layer and a metal electrode which are stacked in sequence on the transparent substrate, wherein the organic electroluminescence elements comprising the light emitting layers made of different organic compound materials and taking on different colors of light emission, and wherein some of functional layers, having the same function, of said organic compound material layers excluding the light emitting layer have different thicknesses corresponding to colors of emitted light respectively.

In an aspect of the organic electroluminescence multi-color display device according to the invention, each of said transparent electrodes in all of said organic electroluminescence elements has a constant thickness.

In another aspect of the organic electroluminescence multi-color display device according to the invention, said functional layers in all of said organic electroluminescence elements are made of the same organic compound material.

In a further aspect of the organic electroluminescence multi-color display device according to the invention, said functional layers in all of said organic electroluminescence elements have a continuous common layer made of the organic compound material with a constant thickness, and have complementary layers made of the same organic compound material as that of said common layer and stacked on said common layer in different thicknesses corresponding to colors of emitted light respectively.

In a still further aspect of the organic electroluminescence multi-color display device according to the invention, said functional layers in all of said organic electroluminescence elements have a continuous common layer made of the organic compound material with a constant thickness, and have complementary layers made of organic compound materials different from that of said common layer and stacked on said common layer in different thicknesses corresponding to colors of emitted light respectively.

In another aspect of the organic electroluminescence multi-color display device according to the invention, said functional layer is a hole transport layer stacked adjacent to the anode.

As to a further aspect of the organic electroluminescence multi-color display device according to the invention, the device further comprises a hole injection layer stacked in between said hole transport layer and said anode.

In a still further aspect of the organic electroluminescence multi-color display device according to the invention, said functional layer is an electron transport layer stacked adjacent to the cathode.

As to another aspect of the organic electroluminescence multi-color display device according to the invention, the device further comprises an electron injection layer stacked in between said electron transport layer and said cathode.

In a further aspect of the organic electroluminescence multi-color display device according to the invention, the light-emitting interface of the light-emitting layer emitting light having a wavelength of $\lambda$ serving as a primary component, and wherein the transparent electrode side portion in the organic compound material layers is deposited to have a film thickness such that an optical distance from the light-emitting interface to the interface with the largest difference in refractive indexes is substantially equal to even multiples of one-quarter of the wavelength λ.

In a still further aspect of the organic electroluminescence multi-color display device according to the invention, the metal electrode side portion in the organic compound material layers is deposited to have a film thickness such that an optical distance from the light-emitting interface to an interface bordering on the metal electrode is substantially equal to odd multiples of one quarter of the wavelength λ.

In addition, a method for fabricating an organic electroluminescence multi-color display, according to the present invention, includes: a transparent substrate; and a plurality of organic electroluminescence elements each including, a transparent electrode, a plurality of organic compound material layers including at least one light emitting layer and a metal electrode which are stacked in sequence on the transparent substrate, in which the organic electroluminescence elements containing the light emitting layers made of different organic compound materials and taking on different colors of light emission, said method comprising the steps of:
stacking a continuous common layer made of the organic compound material in all organic electroluminescence elements and having a constant thickness, and
stacking at least one complementary layer in contact with said common layer at a different thickness corresponding to colors of emitted light, before or after the step of stacking the common layer, whereby some of functional layers, having the same function, of said organic compound material layers excluding the light emitting layer have different thicknesses corresponding to colors of emitted light respectively.

In an aspect of the method according to the invention, said transparent electrode is deposited in all of said organic electroluminescence elements to have a constant thickness.

In another aspect of the method according to the invention, said complementary layer is formed from the same organic compound material as that of said common layer.

In a further aspect of the method according to the invention, said complementary layer is formed from an organic compound material different from that of said common layer.

In a still further aspect of the method according to the invention, said organic compound material layer is stacked on the anode as a hole transport layer.

In another aspect of the method according to the invention, a hole injection layer is stacked in between said hole transport layer and said anode.

In a further aspect of the method according to the invention, said organic compound material layer is stacked on the cathode as an electron transport layer.

In a still further aspect of the method according to the invention, an electron injection layer is stacked in between said electron transport layer and said cathode.

In another aspect of the method according to the invention, the light-emitting interface of the light-emitting layer emitting light having a wavelength of λ serving as a primary component, and wherein the transparent electrode side portion in the organic compound material layers is deposited to have a film thickness such that an optical distance from the light-emitting interface to the interface with the largest difference in refractive indexes is substantially equal to even multiples of one-quarter of the wavelength λ.

In a further aspect of the method according to the invention, the metal electrode side portion in the organic compound material layers is deposited to have a film thickness such that an optical distance from the light-emitting interface to an interface bordering on the metal electrode is substantially equal to odd multiples of one quarter of the wavelength λ.

In a still further aspect of the method according to the invention, said organic compound material layer and said metal electrode are stacked by vapor deposition using a mask.

According to the present invention, the organic compound material layers are formed in two or more processes for depositing such as the common layer and the complementary layer to adjust the thickness of the complementary layer of the organic compound material layers. Such organic EL elements can thereby be obtained that can provide improved light emission efficiency.

DETAILED DESCRIPTION OF THE PREFERRED EMBODIMENTS

Embodiments of an organic EL element and the method for fabricating the element, according to the present invention, are explained with reference to the drawings.

In a first embodiment, an organic EL multi-color display is explained in which the hole transport layer is formed from a common organic compound material as the organic compound material layers irrespective of colors of emitted light of the EL element.

Figure 1:
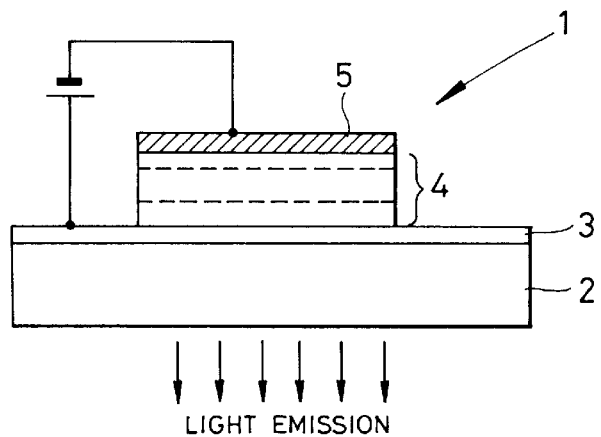
FIG. 1 is a schematic cross-sectional view showing an organic EL element.
Figure 2:
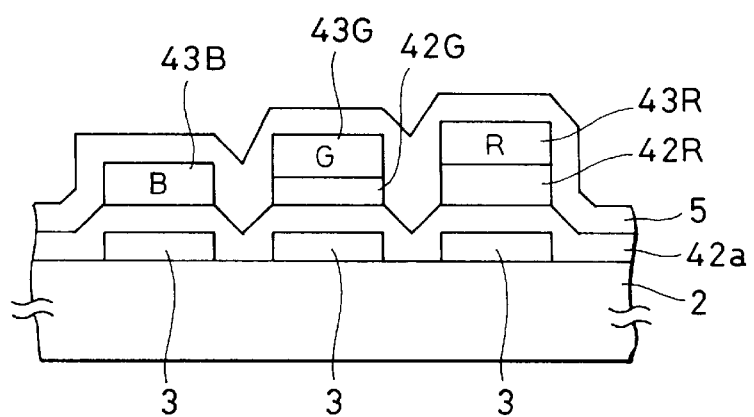
FIG. 2 is a schematic partially cross-sectional view showing an organic EL multi-color display according to an embodiment of the present invention.

The organic EL multi-color display shown in FIG. 2 comprises a plurality of organic EL elements. Each of the organic EL elements comprises a transparent electrode 3 as the anode made of ITO or the like, a hole transport layer comprising a hole transport layer common layer 42a and hole transport layer complementary layers 42G, 42R, each of which is made of organic compound materials, light emitting layers 43B, 43G, 43R, made of organic compound materials, and a metal electrode 5 as the cathode, each of which is stacked in sequence on a transparent substrate 2 such as made of glass. In addition, there is provided a sealing film (not shown) made of $SiN_4$ on the metal electrode 5, thereby isolating each of the organic EL elements from the atmosphere.

The light emitting layers 43B, 43G, 43R, which are stacked independently and individually, comprise different organic compound materials that show different colors of emitted light of blue, green, and red on application of current, respectively. As such, the organic EL multi-color display has, as a pixel, a group of the organic EL elements with colors of emitted light of blue, green, and red, and for example has a plurality of these pixels arranged in a matrix.

The hole transport layer common layer 42a is a common layer made of the same material as used for that of all adjacent organic EL elements and having a constant continuous thickness. The hole transport layer complementary layers 42G, 42R are made of the same organic compound material as that of the hole transport layer common layer 42a. The hole transport layer complementary layers 42G, 42R are stacked on the common layer 42a independently and individually with each having a different thickness of film corresponding to each color of emitted light of green and red. The thickness of film of the hole transport layer common layer 42a is set to the thinnest thickness corresponding to the emitted light color of blue of the light emitting layer 43B.

By the combination of a complementary layer and the common layer, each hole transport layer is to have a different thickness of film corresponding to each color of emitted light (wavelength λ). That is, in the organic EL elements, any one of the functional layers of the organic compound material layers, excluding the light emitting layers and having the same function, has a different thickness of film corresponding to the color of emitted light. Therefore, the setting of the thickness of the film of the hole transport layer, the common layer 42a, and the hole transport layer complementary layers 42G, 42R enables defining the optimum position of the light emitting layers for obtaining each of the colors of emitted light. Accordingly, this enables forming the transparent electrode 3 of all organic EL elements in a constant thickness without the necessity to change the thickness thereof.

Furthermore, in the aforementioned embodiment, the hole transport layer complementary layers 42G, 42R are formed from the same organic compound material as that used for the hole transport layer common layer 42a. However, as a second embodiment, the hole transport layer complementary layers 42G, 42R may be made of materials different from that of the hole transport layer common layer 42a, respectively. That is, different hole transport organic compound materials may be used to form each of the light emitting layers 43B, 43G, 43R of three colors of emitted light.

Figure 3:
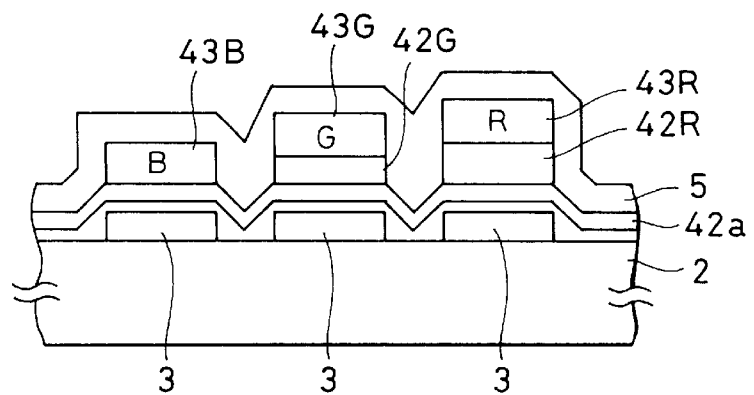
FIGS. 3 through 7 are schematic partially cross-sectional views each showing an organic EL multi-color display according to other embodiments of the present invention; respectively.

As a third embodiment shown in FIG. 3, such an organic EL multi-color display may be employed that has a hole injection layer 41 stacked in between the hole transport layer common layer 42a and the ITO anode 3 and otherwise has the same configuration as the aforementioned embodiment.

Figure 4:
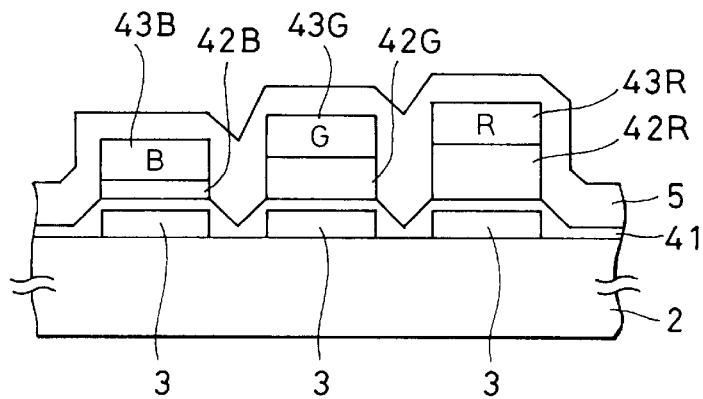

In addition, as a fourth embodiment shown in FIG. 4, such an organic EL multi-color display may be employed that has the hole injection layer 41 stacked on the transparent electrode 3 as a common layer, on which the hole transport layer complementary layers 42B, 42G, 42R, each having a different thickness and made of the same organic compound material, are stacked, and has otherwise the same configuration as the aforementioned embodiment. Moreover, such an organic EL multi-color display may be employed that has the hole transport layer complementary layers 42B, 42G, 42R, having a different thickness and made of different materials, stacked on the common layer of the hole injection layer 41 and otherwise has the same configuration as the aforementioned embodiment.

Figure 5:
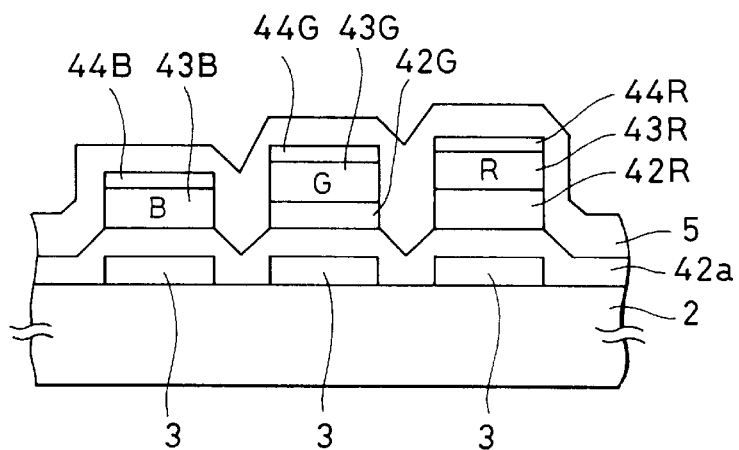

Furthermore, as a fifth embodiment shown in FIG. 5, such an organic EL multi-color display may be employed that has each of electron transport layers 44B, 44G, 44R, stacked in between each of the light emitting layers 43B, 43G, 43R and the metal electrode 5, and otherwise includes the same organic EL elements with a three layer configuration as the aforementioned embodiment. In a modified example of the fifth embodiment, such an organic EL multi-color display may be employed that has an electron injection layer is stacked in between the electron transport layers 44B, 44G, 44R and the metal electrode 5, and otherwise is the same as the aforementioned embodiment.

Figure 6:
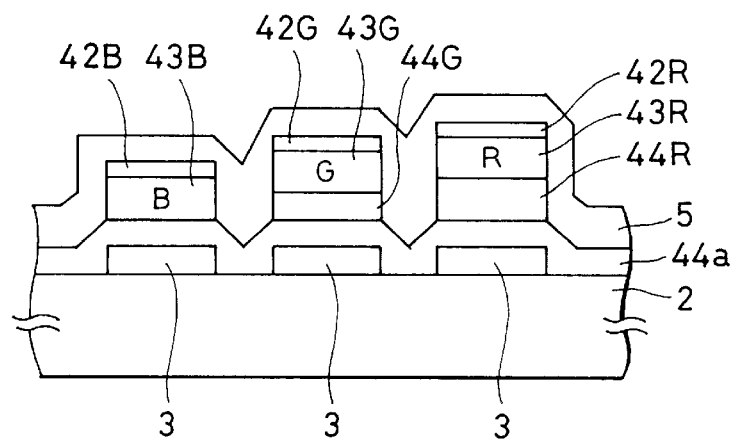

Moreover, the aforementioned embodiment employs the transparent electrode 3 comprising ITO or the like as the anode and the metal electrode 5 as the cathode. However, in a sixth embodiment, as shown in FIG. 6, such a configuration can be employed that the transparent electrode 3 comprising ITO or the like is used as the cathode and the metal electrode 5 as the anode, with a functional layer stacked in between the electrodes. That is, such an organic EL multi-color display may be employed in which an electron transport layer common layer 44a made of an organic compound material is stacked on the transparent electrode 3 on the transparent substrate 2, while an electron transport layer comprising electron transport layer complementary layers 44G, 44R made of an organic compound material, the light emitting layers 43B, 43G, 43R made of an organic compound material, and the hole transport layers 42B, 42G, 42R corresponding to the materials of the light emitting layers are stacked in sequence in the respective predetermined positions.

Figure 7:
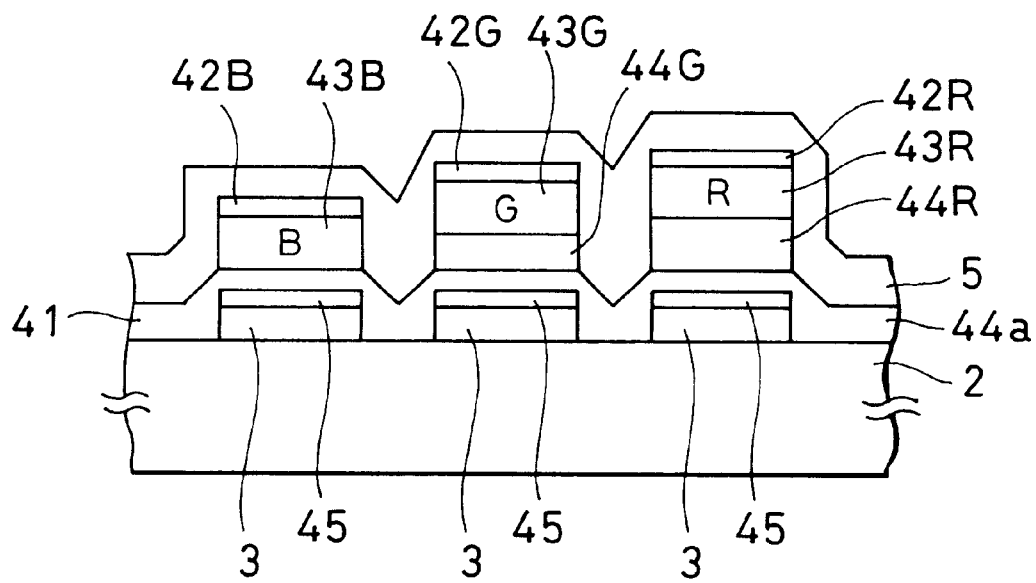

Furthermore, as a seventh embodiment shown in FIG. 7, such an organic EL multi-color display may be employed that has an electron injection layer 45 is stacked in between the electron transport layer common layer 44a and the ITO cathode 3, and is otherwise the same as the aforementioned sixth embodiment. In the modified example according to the seventh embodiment, the electron injection layers 45 may be formed from the same material and independently as well as may be formed as a common layer. Furthermore, in the aforementioned sixth and seventh embodiments, a hole transport layer is stacked in between each of the light emitting layers 43B, 43G, 43R and the metal electrode 5, however, such an organic EL multi-color display may be employed that excludes the hole transport layer but includes an organic EL element having a two-layer configuration.

Figure 20:
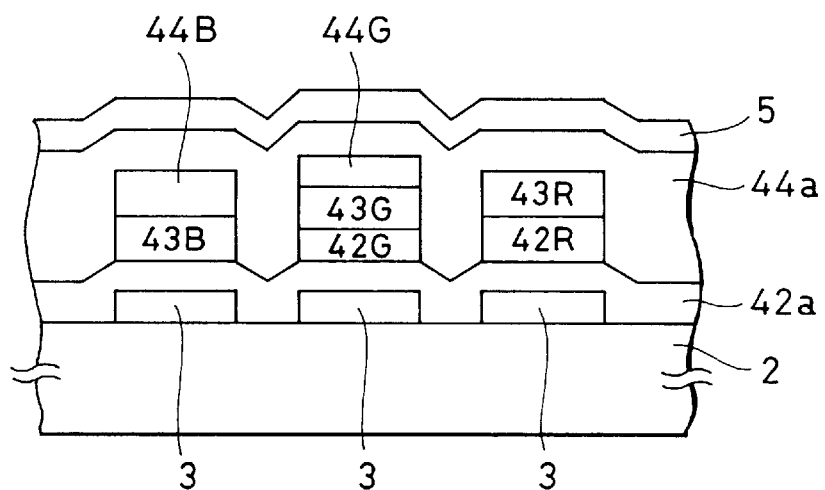
FIGS. 20 and 21 are schematic partially cross-sectional views each showing a fabricated example of an organic EL multi-color display panel according to the present invention.

Still furthermore, in addition to the first embodiment of FIG. 2 showing the element of the two-layer configuration made of an organic compound material, FIG. 20 shows an eighth embodiment. The organic EL multi-color display having a three-layer configuration may be employed in which the electron transport layer complementary layers 44B, 44G are stacked on the two-layer configuration made of an organic compound material of FIG. 2, that is, on the light emitting layers 43B, 43G made of an organic compound material, respectively, and further the electron transport layer common layer 44a made of an organic compound material is stacked thereon.

Next, the fabricating process of a display panel of the organic EL multi-color display is explained.

Figure 8:
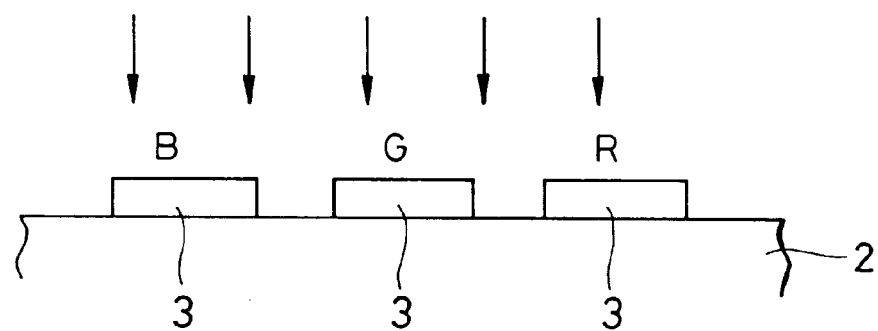
FIGS. 8 through 13 are schematic partially cross-sectional views each showing a substrate in the process by a method for fabricating an organic EL multi-color display according to the embodiments of the present invention, respectively.

First, as shown in FIG. 8, the B, G, and R transparent electrodes (anodes) 3 made of ITO are extended in parallel to and formed on the glass substrate 2, respectively. After an ITO transparent layer is deposited by sputtering or the like, the ITO transparent layer is patterned into the electrodes 3 with a constant thickness by means of etching or the like. The drawing shows lines defining the ITO layers, and a metal having a low resistivity such as Al may be further stacked on the ITO layers. Moreover, on the substrate 2 comprising each of the conductive portions of the ITO, an insulating layer such as made of polyimide may be deposited which has an opening for exposing the transparent electrode 3 in order to allow a light emitting layer including a light emitting organic electroluminescence material to be stacked. Moreover, a plurality of ribs, made of photosensitive polyimide, for patterning cathode lines may be provided in parallel to each other, orthogonal to the transparent electrode lines 3.

Figure 9:
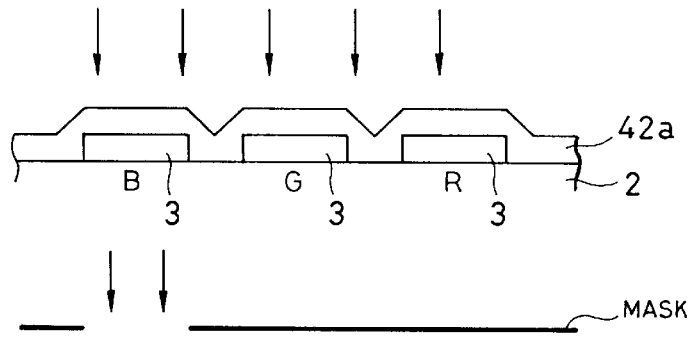

Next, as shown in FIG. 9, the hole transport layer common layer 42a is deposited entirely to cover the glass substrate 2 and the transparent electrode 3 by means of the vacuum vapor deposition or the like. In addition, prior to the deposition of the hole transport layer common layer 42a, a process may be added in which the hole injection layer is deposited on the transparent electrode 3 to dispose the hole injection layer in between the hole transport layer and the anode.

Figure 10:
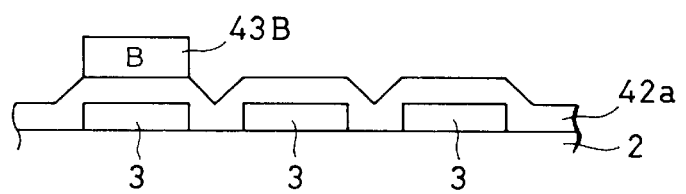

Next, as shown in FIG. 10, on the upper portion corresponding to the predetermined transparent electrode 3 on the hole transport layer common layer 42a, a blue light emitting organic EL medium of B, G, and R is deposited in a predetermined thickness to form the light emitting layer 43B, using a predetermined light emitting layer deposition mask.

Figure 11:
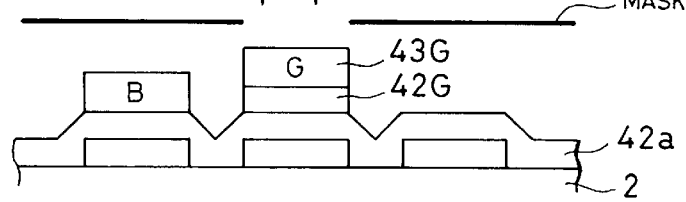

Next, as shown in FIG. 11, the opening of the light emitting layer deposition mask is moved to the upper portion corresponding to the subsequent transparent electrode 3 on the hole transport layer common layer 42a. Then, the hole transport layer complementary layer 42G suitable as a green light emitting organic EL medium of B, G, and R is deposited, and further thereon, the green light emitting organic EL medium is deposited in a predetermined thickness to form the light emitting layer 43G.

Figure 12:
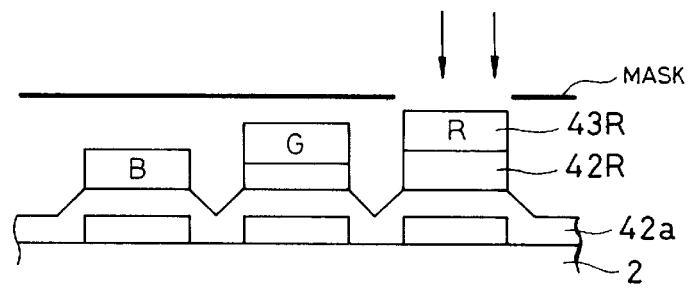

Likewise, as shown in FIG. 12, the opening of the light emitting layer deposition mask is moved to the upper portion corresponding to the subsequent transparent electrode 3 on the hole transport layer common layer 42a. Then, the hole transport layer complementary layer 42R suitable as a red light emitting organic EL medium of B, G, and R is deposited, and further thereon, the red light emitting organic EL medium is deposited in a predetermined thickness to form the light emitting layer 43R. Here, the hole transport layer complementary layers 42G, 42R are to be deposited using organic compound materials different from each other, however, these complementary layers can be deposited using the same organic compound material as the hole transport layer common layer.

Figure 13:
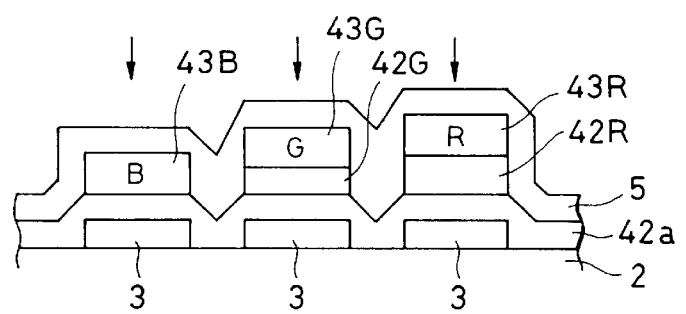

Next, as shown in FIG. 13, the deposition mask is removed and a metal having a low work function such as Al—Li is deposited on the light emitting layers 43B, 43G, 43R of the three types of deposited organic EL media by means of vapor deposition, sputtering or the like into the cathode metal electrode 5. The metallic film may be deposited as thick as possible unless the thickness thereof would not cause trouble. The processes described above make it possible to fabricate the display panel of the organic EL multi-color display according to the embodiment.

In the processes of the embodiments shown in FIG. 8 through FIG. 13, such an explanation is given that the organic compound material layer sandwiched by both electrodes has the two-layer configuration in which the hole transport layer common layer, the complementary layer, and the light emitting layer are stacked in that order. However, in the case where the hole transport layer complementary layer is deposited using the same organic compound material as that of the hole transport layer common layer, such a two-layer configuration may be employed in which the hole transport layer complementary layer, the common layer, and the light emitting layer are stacked in that order. That is, before or after the common layer stacking process for stacking the common layer, the complementary layer in contact with the common layer may be stacked in a different thickness corresponding to each of the colors of emitted light.

The present invention can employ not only the aforementioned organic EL elements of the two-layer configuration but also a three-layer configuration in which the electron transport layer is stacked further on the light emitting layer. In this case, a process (FIG. 13) for depositing the electron transport layer on the light emitting layers 43B, 43G, 43R is added to between the process (FIG. 12) for depositing the light emitting layer and the process (FIG. 13) for depositing the cathode metal electrode on the light emitting layer, both of which are according to the embodiments shown in FIG. 8 through FIG. 13. Furthermore, the electron injection layer may be disposed in between the electron transport layer and the cathode by adding a process for depositing the electron injection layer on the electron transport layer after the electron transport layer has been stacked.

As such, according to the present invention, at least one organic compound material layer of the hole transport functional layer (hole injection layer, hole transport layer) on the anode side and the electron transport functional layer (the electron injection layer, the electron transport layer) on the cathode side, both of which sandwich the light emitting layer is deposited in two or more processes for the common layer and the complementary layer in order to adjust the thickness of the complementary layer of an organic compound material layer. This makes it possible to improve the external light emission efficiency, however, the setting of the thickness of the common layer and the complementary layer requires the setting the thickness of the organic compound material layer of the following settings (a) on the cathode side and (b) on the anode side.

(a) Setting the Optical Film Thickness on the Cathode Side (the light emitting layer, the electron transport layer)

First, on the precondition that the ITO and the hole transport layer have a constant thickness, the thickness of the organic compound material layer on the cathode side is adjusted to obtain the desired light emission spectrum. This is done to minimize the attenuation cause by interference since a largest amount of reflected light from the cathode side is found at the light emission boundary. In the case where the light emitting layer has a guest/host configuration, the dope of the guest material (the portion that emits light)

is adjusted to the desired value. Normally, in order to maximize the intensity of light emission, the primary reflected light at the cathode is made in phase with the emitted light at the light emission boundaries (at the position where the emitted light takes on a peak intensity within the light emitting layer).

(b) Setting the Optical Film Thickness on the Anode Side (hole transport layer)

Adjustment of the thickness of the hole transport layer would vary the spectrum of the emitted light. Hereupon, with the thickness of the film on the cathode side being fixed to the setting, the thickness of the hole transport layer is set so that light is emitted to the desired amount. At this time, the thickness of ITO is made constant. The characteristics may be determined so that the desired wavelength takes on a peak value in the case of the organic EL multi-color display, whereas the organic EL full-color display requires well-balanced setting in consideration of harmony of the three colors.

Making the hole transport layer thicker would cause the current to luminance intensity (I-L) characteristic not to be varied, however, the voltage to luminance intensity (V-L) characteristic to deteriorate. By making use of this nature, it is possible to make the drive condition the same for each of the colors. The settings (a) and (b) of optical film thickness described above, are carried out in that order on each of the R, G, and B organic EL elements.

Next, there are explained the optical film thickness and method for emitting light predominantly composed of the desired wavelength λ from each of the organic EL elements.

It has been known that the distribution of light emission intensity within the light emitting layer of the organic EL element is strong on the boundary surface, wherein the hole transport layer and the like are placed, close to the transparent electrode, and decreases with decreasing distance to the metal electrode, on which the electron transport layer and the like are placed. That is, it is known that the distribution is an exponential distribution with respect to the film thickness of the light emitting layer, and that the interface close to the transparent electrode is the light emitting interface having the peak in light emission intensity.

Figure 14:
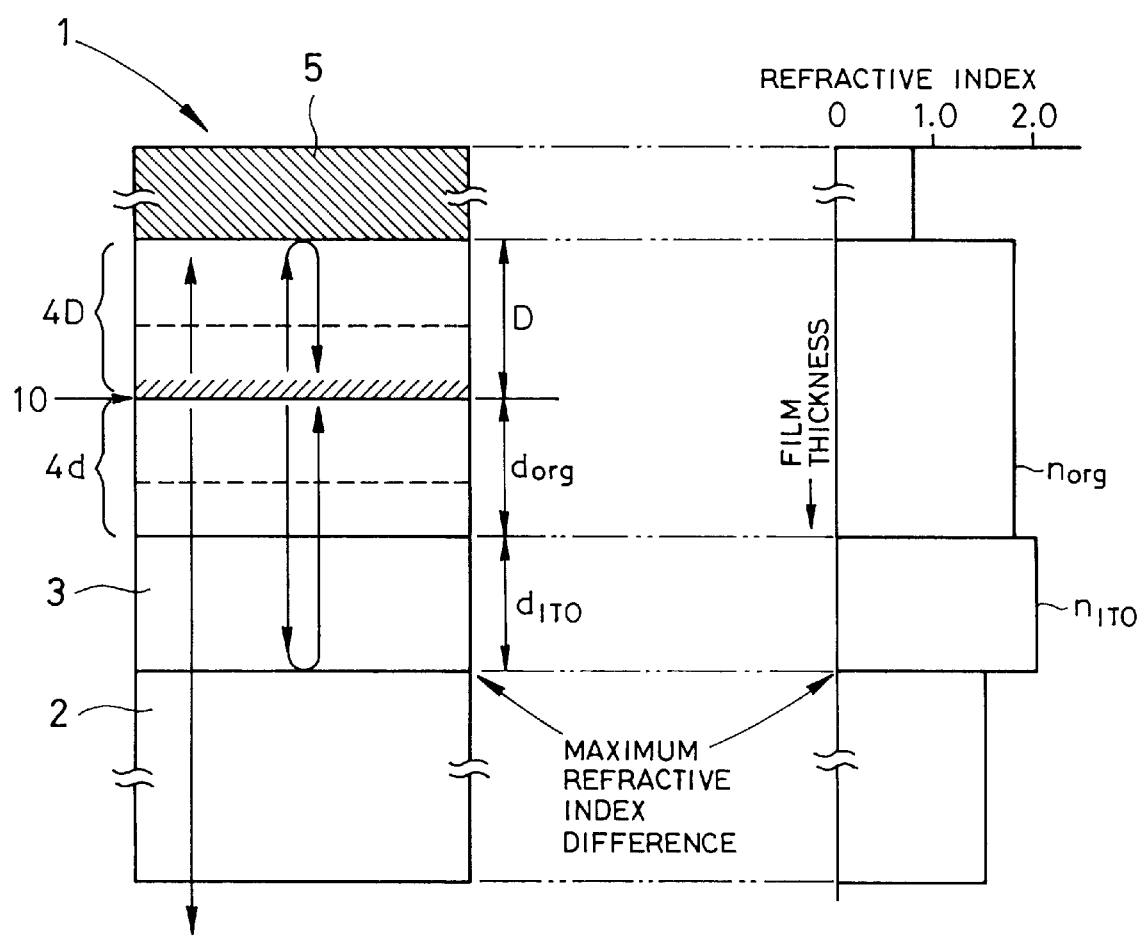
FIG. 14 is a sectional view showing the organic EL element of the present invention.

As shown in FIG. 14, in the organic EL element 1 having a structure wherein the ITO transparent electrode 3, a plurality of organic compound material layers 4 including the light emitting layer, and the metal electrode 5 are deposited in this order on the glass substrate 2, the organic compound material layers are partitioned with the light emitting interface 10 of the light emitting layer into the transparent electrode side portion 4d and the metal electrode side portion 4D.

In the organic EL element 1, the interface between the metal electrode 5 and the organic compound material layer 4D can be regarded as a total-reflecting interface. Accordingly, light traveling from the light emitting interface 10 of the light emitting layer to the metal electrode is totally reflected and goes through the light emitting interface 10, thereby to contribute to external light emission. As a matter of course, most of the light traveling to the transparent electrode 3 contributes to external light emission.

On the other hand, because the refractive index difference between the glass substrate 2 and the transparent electrode 3 is much larger than the differences between other adjacent layers, the interface having the largest refractive index difference in the transparent electrode side portion acts markedly as a reflecting interface. The refractive indices of materials used for fabrication of the organic EL element are as follows: the organic compound material layers 4d and 4D are about 1.8; the ITO transparent electrode 3 is about 2.0; and the glass (soda-lime glass) substrate 2 is about 1.5. Therefore, the difference of refractive index is 0.2 between the organic compound material layer 4d and the ITO transparent electrode 3, and the difference of 0.5 between the glass substrate 2 and the transparent electrode 3. The difference of refractive index between the glass substrate 2 and the transparent electrode 3 is largest in the transparent electrode side portion. In the case of the light traveling from the light emitting interface 10 of the light emitting layer to the transparent electrode 3 and coming back to the light emitting interface 10, the small difference between the organic compound material layer 4d and the transparent electrode 3 is neglected, and the largest refractive index difference between the glass substrate 2 and the transparent electrode 3 is taken into account. The largest refractive index difference can be provided not only between the glass substrate and the transparent electrode, but also within the organic compound material layer 4d, through use of materials having high refractive index deposited therein.

In the organic EL element as shown in FIG. 14, the main light-traveling routes of the light emitted on the light emitting interface are as follows: the route (1) the light goes from the light emitting interface directly to the outside; the route ((2) the light is reflected on the metal electrode, comes back to the light emitting interface, and then goes outside directly; and the route (3) the light is reflected on the glass, comes back to the light emitting interface, and goes outside. The final chromaticity and light emission efficiency are dependent on the course of light interference in the cases of routes (2) and (3) wherein light comes back to the light emitting interface, though the intensity of light back through the route (2) in the light emitting interface is larger than that of the route (3).

Figure 15:
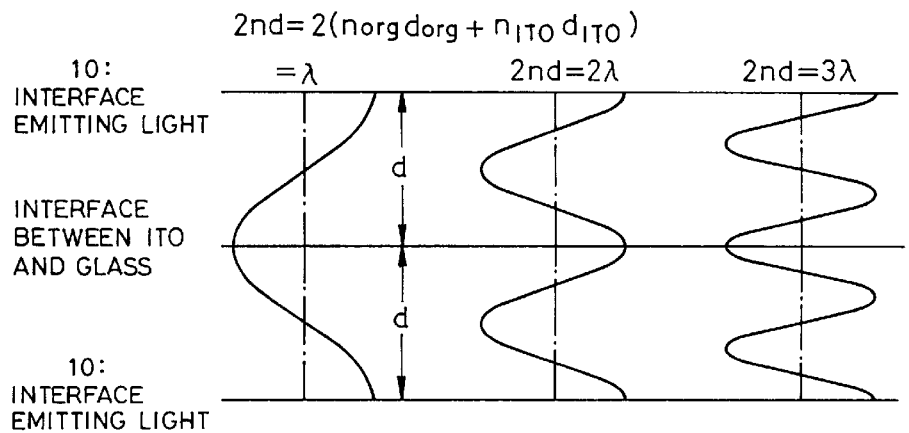
FIG. 15 is a sectional view showing the reflection at a transparent electrode side portion in the organic EL element of the present invention.

First, in the case of setting the optical film thickness at the anode side with the order of (b) above mentioned, the interference in the light-traveling route (3) of the transparent electrode side portion 4d of the organic compound material layer will be considered. As shown in FIG. 14, when the refractive index is "n" and the film thickness is "d", as a whole, of the light which is reflected on the interface between the transparent electrode 3 and the glass substrate 2 and comes back to the light emitting interface, its length of optical path (2 nd) is the sum of the length of the optical paths in the organic compound material layer and the transparent electrode, and can be expressed by the following formula:

$$2nd = 2(n_{org}d_{org} + n_{ITO}d_{ITO})$$

wherein $n_{org}$ is the refractive index of the organic compound material layer 4d; $d_{org}$ is the film thickness of the organic compound material layer 4d; $n_{ITO}$ is the refractive index of the transparent electrode 3; and $d_{ITO}$ is the film thickness of the transparent electrode 3. Accordingly, when the length of the optical path of the going and returning light "2nd" is equal to integer multiple of the wavelength λ which is emitted and is to be taken out, the interference between the returning light and the emitted light becomes maximum. As shown in FIG. 15, therefore, the optical distance, from the light emitting interface to the interface of the largest refractive index difference, which is used for establishment of the film thickness of the organic compound material layer 4d giving the maximum interference effect, can be expressed by the following formula:

$$2(n_{org}d_{org}+n_{ITO}d_{ITO})=j\cdot\lambda$$

$$\therefore (n_{org}d_{org}+n_{ITO}d_{ITO})=2j\cdot(\lambda/4)$$

wherein "j" represents an integer of 1 or more. When the total film thickness of the organic compound material layer 4d and the transparent electrode 3 is established to be approximately the length of the optical distance, the interference enhances the light emission efficiency. More specifically, for purpose of setting the total thickness of the organic compound material layers 4d, i.e., common layer and complementary layers to obtain the maximum interference effect, the transparent electrode side portion of those organic compound material layers are deposited to have a film thickness such that the optical distance ($n_{org}d_{org}+n_{ITO}d_{ITO}$) from the light emitting interface 10 to the interface of the largest refractive index difference is approximately equal to even multiples of one quarter of the wavelength of $\lambda$.

Figure 16:
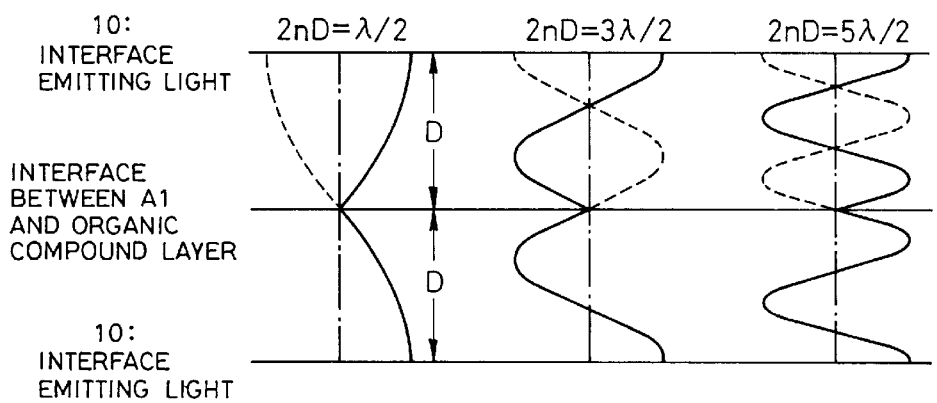
FIG. 16 is a sectional view showing the reflection at a metal electrode side portion in the organic EL element of the present invention.
Figure 17:
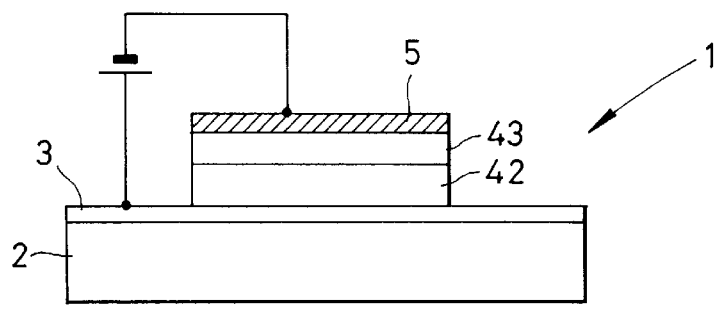
FIG. 17 is a cross-sectional view of an organic EL element fabricated for a test.

Moreover, in the case of the setting (a) for the optical film thickness on the cathode side, the interference in the light-traveling route (2) of the metal electrode side portion 4D of the organic compound material layer will be considered. As shown in FIG. 14, since the reflection occurs on the interface between the metal electrode 5 and the metal electrode side portion 4D of the organic compound material layer, a phase difference $\pi$ occurs before and after the reflection of light. Accordingly, when the refractive index is "n" and the film thickness is "D", as a whole, of the metal electrode side portion 4D of the organic compound material layer of the light returning to the light emitting interface, the length of the optical path can be expressed by "2 nD". As shown in FIG. 16, when the length of the optical path (2 nD) of the going and returning light is equal to the wavelength ($\lambda/2$, $3\lambda/2$, $5\lambda/2$, . . . ) of the light emitted and is to be taken out, the interference of the returning light and the emitted light becomes maximum. The film thickness of the organic compound material layer 4D (a total thickness of the common layer and complementary layers) wherein the maximum interference effect is obtained, that is, the optical distance from the light emitting interface 10 to the metal electrode 5 can be expressed by the following formula:

$$2nD=[(2j-1)/2]\lambda$$

$$\therefore nD=[(2j-1)/4]\lambda$$

wherein "j" represents an integer of 1 or more. When the film thickness "D" of the organic compound material layer 4D is established to be approximately the length of the optical distance, the interference enhances the light emission efficiency. More specifically, the film thickness "D" of the metal electrode side portion of the organic compound material layer is deposited to have a film thickness such that the optical distance "nD" from the light emitting interface 10 to the interface bordering on the metal electrode 5 is approximately equal to odd multiples of one quarter of the wavelength of $\lambda$.

In the case of fabrication of organic EL elements, as the first forming step of the organic compound material layer, the transparent electrode side portion of the organic compound material layer is formed on the transparent electrode formed on the light-transmitting substrate by depositing one or more of the organic compound material layers, other than the light emitting layer emitting a light having a wavelength of $\lambda$ and serving as a primary component, which have a film thickness such that the optical distance from the light emitting interface of the light emitting layer to the interface having the largest refractive index difference is approximately equal to even multiples of one quarter of the wavelength of $\lambda$. Subsequently, as the second forming step of the organic compound material layer, the metal electrode side portion of the organic compound material layer is formed on the transparent electrode side portion of the organic compound material layer by depositing the light emitting layer and the remaining portion the organic compound material layer such that the light emitting layer and the remaining portion have a film thickness wherein the optical distance from the light emitting interface of the light emitting layer to the interface on the metal electrode is approximately equal to odd multiples of one quarter of the wavelength of $\lambda$, and then the metal electrode is formed on the metal electrode side portion of the organic compound material layer.

Since the element has the foregoing structure, as the film thickness of the organic compound material layer is gradually increased, the film thickness wherein the phases in the above described light-traveling routes agree with each other appears one after another. In particular, as the film thickness is increased, the element demonstrates the maximum and minimum values in the light emission efficiency characteristics with respect to the film thickness of the transparent electrode side portion of the organic compound material layer. In other words, the light emission efficiency characteristics depend on the total film thickness of the organic compound material layers of the transparent electrode side.

For example, as shown in FIG. 14, a plurality of organic EL elements were fabricated in which the transparent electrode (anode) 3, the hole transport layer 42, the light emitting layer 43, and the metal electrode (cathode) 5 are deposited in that order on the substrate 2, in which those layer are made of a material (in a thickness) of ITO (100 nm or 175 nm), TPD (40–200 nm), aluminum oxine chelate Alq3 (60 nm), and aluminum lithium alloy Al—Li respectively. Each of the elements having hole transport layers different in thickness as such was subjected to the measurement of the external quantum efficiency of the organic EL element and the EL spectrum.

Figure 18:
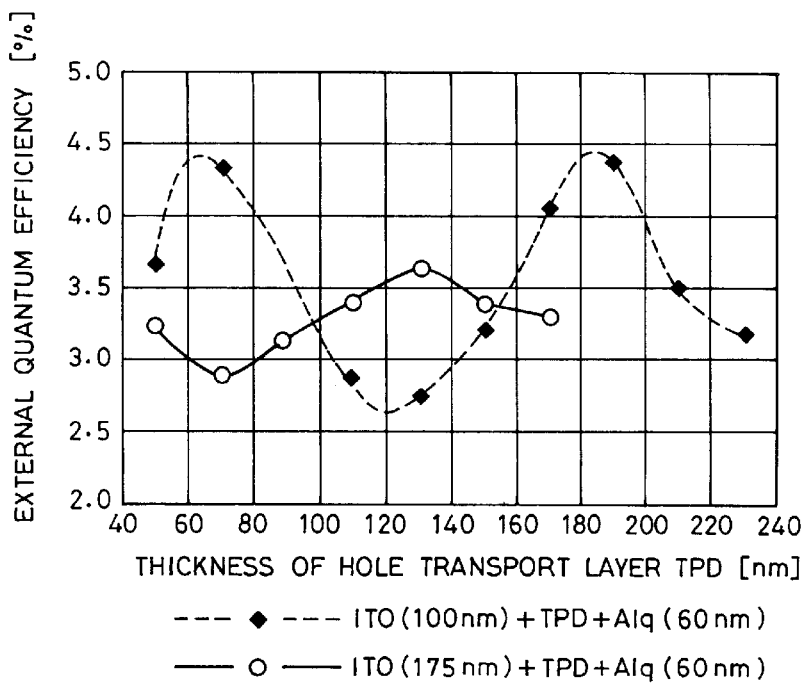
FIG. 18 is a graph showing the characteristics of the external quantum efficiency in relation to the thickness of a hole transport layer of an organic EL element according to the present invention.

FIG. 18 shows the relationship between the thickness of the hole transport layer that is a part of the organic compound material layer and the external quantum efficiency of the organic EL element. The plot with the horizontal axis representing the thickness of the hole transport layer and the vertical axis representing the external quantum efficiency shows that the efficiency increases and decreases periodically as shown in FIG. 18 with respect to a transparent electrode of the same thickness (100 nm or 175 nm). In FIG. 18, two types of transparent electrodes 100 nm and 175 nm in thickness are plotted with the curves of a dotted line and a solid line, respectively. As for the relationship between both curves, the curves have the same period of an increase and decrease but are about half the period out of phase with each other. This is because the difference in thickness (75 nm) between the two types of transparent electrodes is optically an odd multiple of half the wavelength of the peak wavelength (520 nm) of the EL spectrum, so that the strengths of interference are 180° out of phase with each other. Moreover, when the stepped difference in refractive index between the transparent electrode and the organic compound material layer is large, the difference in amplitude between both curves is considered caused by the effect of the reflection from this boundary surface.

Figure 19:
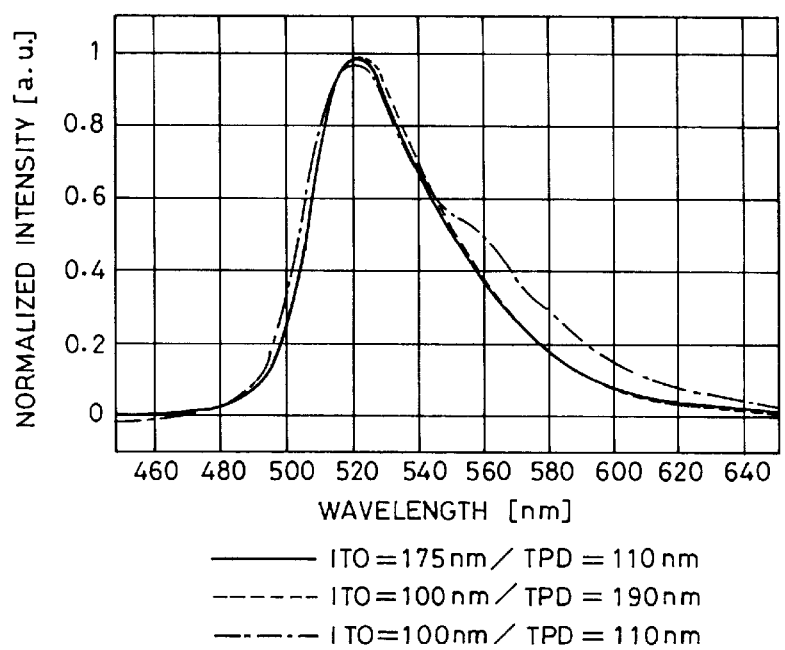
FIG. 19 is a graph showing the spectrum of an organic EL element according to the present invention.

Varied is not only the intensity efficiency of the EL but also the light emission spectrum. FIG. 19 shows three types of EL spectra of organic EL elements fabricated. The solid line represents the spectrum of the organic EL element 175 nm in the thickness of the transparent electrode, while the dashed line represents the spectrum of the organic EL element 100 nm in the thickness of the transparent electrode. The curves are so normalized that the maximum peak of the spectrum takes on 1.0. Excluding the film thickness of the transparent electrodes, the both are completely the same to each other, however, it can be found that the spectrum of the organic EL element 100 nm in the thickness of the transparent electrode is broader than that of the organic EL element 175 nm in the thickness of the transparent electrode and the color varies in accordance with the film thickness of the transparent electrode.

The curve shown by a dotted line in FIG. 19 was obtained by adjusting the film thickness of the hole transport layer to make the optical distance between the light emitting surface and the boundary surface between the glass and transparent electrode the same as that of the element represented by the solid line. Specifically, the difference of 75 nm in film thickness between the transparent electrodes was compensated by making the hole transport layer thicker by 80 nm. The dotted line and the solid line show substantially the same spectrum and the elements were made possible to be fabricated without varying the colors thereof.

The correction of the film thickness of the transparent electrode by varying the thickness of the hole transport layer allows the optical configuration to be assumed the same, so that the efficiency of light emission can be made equal. However, when the reflection on the boundary surface of the transparent electrode and the hole transport layer exerts an effect, the peak value of the maximum efficiency possibly varies depending on the thickness of the ITO transparent electrode in some cases.

As can be seen from the results described above, the distance between the substrate and the boundary surface of light emission can be varied without changing the efficiency and colors by optimizing the optical film thickness of the hole transport layer with the transparent electrode being kept constant in film thickness.

Furthermore, when a multi-color light emitting portion is fabricated on the same substrate, the optimum distance between the substrate and the boundary surface of light emission is different depending on the color of light emission. However, by adjusting the film thickness of the hole transport layer of each color so as to obtain the optimum optical distance, a multi-color light emitting portion that has the optimum current efficiency and color can be fabricated on the transparent electrode of the same thickness.

Figure 21:
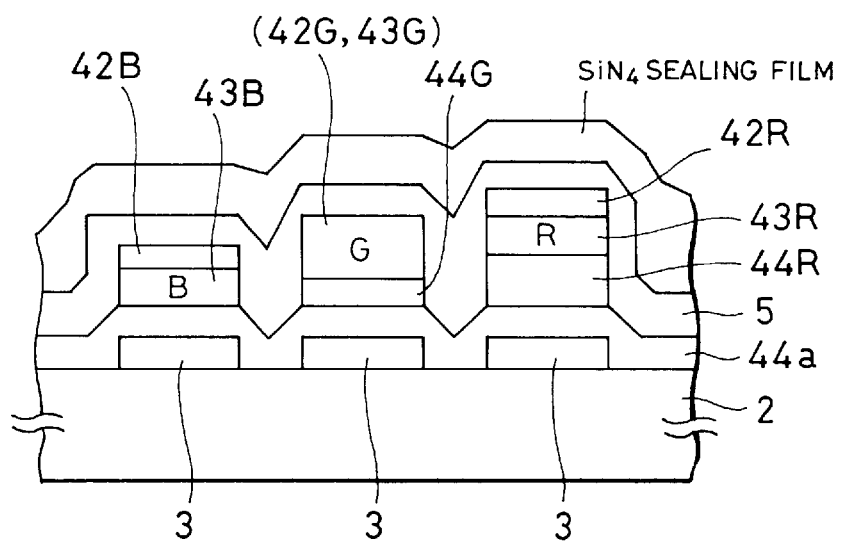

As specifically shown in FIG. 21, a panel having a transparent glass substrate was fabricated which is sealed with a $SiN_4$ sealing film layer and comprises organic EL elements having a two-layer and three-layer configuration.

First, the thickness of the optical film on the cathode side of the aforementioned (a) was designed in accordance with the thickness of the optical film for emitting light predominantly composed of the desired wavelength $\lambda$ of each organic EL element and the setting method. On the precondition that the ITO and the hole transport layer have a film of a constant thickness, the design was carried out by adjusting the film thickness of the light emitting layer on the cathode side and the electron transport layer so as to be able to obtain the desired light emission spectrum. Here, the light emitting layer has a guest/host configuration, the dope of the guest material was adjusted to the desired value. The values assumed and the results are shown in Table 1.

TABLE 1

| | Transparent electrode [Material/ thickness(nm)] | Hole transport layer [Material/ thickness(nm)] | Light emitting layer [Material/ thickness(nm)] | Electron transport layer [Material/ thickness(nm)] |
|---|---|---|---|---|
| B | ITO/100 | TPD/70 | PC-7**/30 | Alq/20 |
| G | ITO/100 | TPD/70 | Alq/60 | |
| R | ITO/100 | TPD/70 | Alq: DCM*/40 | Alq/30 |

*0.8% by volume of DCM was doped into Alq. DCM stands for 4-(dicyano methylene)-2-methyl-6(p-dimethyl aminostyryl)-4H-pyran.
**PC-7 stands for bis(2-methyl-8-quenolilate)(para-phenyl-phenolate) aluminum(III).

Next, the film thickness of the optical film of the hole transport layer on the anode side of the aforementioned (b) was designed in accordance with the thickness of the optical film for emitting light predominantly composed of the desired wavelength $\lambda$ of each organic EL element and the setting method. With the thickness of the aforementioned cathode side film being fixed to the setting, the film thickness of the hole transport layer was set so as to allow the desired amount of light to be emitted. The results are shown in Table 2.

TABLE 2

| Light emitting layer | Thickness (nm) | Organic compound material | Peak wavelength (nm) | TPD common layer 42a (nm) | TPD common layer (nm) |
|---|---|---|---|---|---|
| 43B | 30 | PC-7** | 480 | 40 | — |
| 43G | 60 | Alq | 530 | 40 | 20 (42G) |
| 43R | 40 | Alq: DCM* | 620 | 40 | 45 (42R) |

Table 3 shows the specifications of the organic EL multi-color display that was fabricated.

TABLE 3

| | Transparent electrode (3) [Material/ thickness (nm)] | Hole transport layer common layer(42a) [Material/ thickness (nm)] | Hole transport layer complementary layer [Material/ thickness (nm)] | Light emitting layer [Material/ thickness (nm)] | Electron transport layer [Material/ thickness (nm)] |
|---|---|---|---|---|---|
| B | ITO/100 | TPD/40 | — | PC-7**/30 (43B) | Alq/20 (44B) |
| G | ITO/100 | TPD/40 | TPD/20(42G) | Alq/60 (43G, 44G) | |
| R | ITO/100 | TPD/40 | TPD/45(42R) | Alq: DCM*/40 (43R) | Alq/30 (44R) |

What is claimed is:

1. An organic electroluminescence multi-color display device comprising:
    a substrate; and
    a plurality of organic electroluminescence elements formed on the substrate, wherein each of the organic electroluminescence elements includes
        a first electrode formed on the substrate,
        a plurality of organic compound material layers layered on the first electrode, the plurality of organic compound material layers including a light emitting layer, and
        a second electrode layered on the plurality of organic compound material layers, wherein the first electrodes in neighboring organic electroluminescence elements have the same thickness as one another, wherein the light emitting layers in neighboring organic electroluminescence elements are made of different organic compound materials so as to take on different colors of light emission respectively, and wherein the layered organic compound material layers in neighboring organic electroluminescence elements have respective thicknesses between the first and second electrodes, the respective thicknesses of the layered organic compound material layers being set to enhance respective chromaticities and external light emission efficiencies of the elements with interference of light emitted from the respective light emitting layers in the neighboring organic electroluminescence elements.

2. An organic electroluminescence multi-color display device according to claim 1, wherein the organic compound material layers have layers made of the same organic compound material in the neighboring organic electroluminescence elements.

3. An organic electroluminescence multi-color display device according to claim 1, wherein the organic electroluminescence elements have a continuous layer made of an organic compound material belonging equally to the neighboring elements, and wherein some of the organic electroluminescence elements have additional layers layered on the continuous layer so as to have respective thicknesses between the first and second electrodes, the respective thicknesses of the layered organic compound material layers being set to enhance respective chromaticities and external light emission efficiencies of the elements with interference of light emitted from the respective light emitting layers.

4. An organic electroluminescence multi-color display device according to claim 3, wherein the additional layers are made of the same organic compound material as that of the continuous layer.

5. An organic electroluminescence multi-color display device according to claim 3, wherein the additional layers are made of organic compound materials different from that of the continuous layer.

6. An organic electroluminescence multi-color display device according to claim 3, wherein the continuous layer is a hole transport layer.

7. An organic electroluminescence multi-color display device according to claim 6, further comprising a hole injection layer stacked on the hole transport layer.

8. An organic electroluminescence multi-color display device according to claim 3, wherein the continuous layer is an electron transport layer.

9. An organic electroluminescence multi-color display device according to claim 8, further comprising an electron injection layer stacked on the electron transport layer.

10. An organic electroluminescence multi-color display device according to claim 1, wherein the light-emitting layer includes a light-emitting interface for emitting light having a wavelength of $\lambda$ serving as a primary component, the light-emitting interface demarcating the organic compound material layers into a first electrode side portion and a second electrode side portion, and wherein the first electrode side portion in the organic compound material layers is deposited to have a film thickness such that an optical distance from the light-emitting interface to an interface between the substrate and the first electrode is equal to even multiples of one-quarter of the wavelength $\lambda$.

11. An organic electroluminescence multi-color display device according to claim 1, wherein the light-emitting layer includes a light-emitting interface for emitting light having a wavelength of $\lambda$ serving as a primary component, the light-emitting interface demarcating the organic compound material layers into a first electrode side portion and a second electrode side portion, and wherein the second electrode side portion in the organic compound material layers is deposited to have a film thickness such that an optical distance from the light-emitting interface to an interface between the organic compound material layers and the second electrode is equal to odd multiples of one quarter of the wavelength $\lambda$.

12. A method for fabricating an organic electroluminescence multi-color display device, the display device including a plurality of organic electroluminescence elements formed on a substrate, each of the organic electroluminescence elements including first and second electrodes and a light-emitting layer, the method comprising the steps of:
forming first electrodes on the substrate to have the same thickness as one another;
stacking a plurality of organic compound material layers on the first electrodes,
in such a manner that the plurality of organic compound material layers includes light emitting layers which are made of different organic compound materials so as to take on different colors of light emission in neighboring organic electroluminescence elements, and wherein the plurality of organic compound material layers in neighboring organic electroluminescence elements have respective thicknesses to enhance respective chromaticities and external light emission efficiencies of the elements with interference of light emitted from the respective light emitting layers in the neighboring organic electroluminescence elements; and forming second electrodes layered on the plurality of organic compound material layers.

13. A method according to claim 12, wherein the stacking of the plurality of organic compound material layers includes: a step of stacking a continuous layer made of an organic compound material to belong equally to the neighboring elements; and a step of stacking an additional layer in contact with the continuous layer in such a manner that the plurality of organic compound material layers have respective thicknesses between the first and second electrodes, the thicknesses of the layered organic compound material layers being set to enhance respective chromaticities and external light emission efficiencies of the elements with interference of light emitted from the respective light emitting layers.

14. A method according to claim 13, wherein the additional layers are formed from the same organic compound material as that of the continuous layer.

15. A method according to claim 13, wherein the additional layer is formed from an organic compound material different from that of the continuous layer.

16. A method according to claim 13, wherein the continuous layer is a hole transport layer.

17. A method according to claim 16, further comprising a step of stacking a hole injection layer on the hole transport layer.

18. A method according to claim 13, wherein the continuous layer is an electron-transport layer.

19. A method according to claim 18, further comprising a step of stacking an electron injection layer on the electron transport layer.

20. A method according to claim 12, wherein the light-emitting layer includes a light-emitting interface for emitting light having a wavelength of λ serving as a primary component, and wherein a first electrode side portion in the organic compound material layers is deposited to have a film thickness such that an optical distance from the light-emitting interface to an interface between the substrate and the first electrode is equal to even multiples of one-quarter of the wavelength λ.

21. A method according to claim 12, wherein the light-emitting layer includes a light-emitting interface for emitting light having a wavelength of λ serving as a primary component, and wherein a second electrode side portion in the organic compound material layers is deposited to have a film thickness such that an optical distance from the light-emitting interface to an interface between the organic compound material layers and the second electrode is equal to odd multiples of one quarter of the wavelength λ.

22. A method according to claim 12, wherein the organic compound material layers are stacked by vapor deposition using a mask.

* * * * *